(12) United States Patent
Lin

(10) Patent No.: US 6,277,741 B1
(45) Date of Patent: Aug. 21, 2001

(54) METHOD AND PLANARIZING POLYSILICON LAYER

(75) Inventor: Chingfu Lin, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/282,052

(22) Filed: Mar. 29, 1999

(30) Foreign Application Priority Data

Mar. 3, 1999 (TW) ............................................. 88103215 A

(51) Int. Cl.$^7$ ................................................ H01L 21/44
(52) U.S. Cl. ..................... 438/666; 438/669; 438/672; 438/684; 438/719; 438/764
(58) Field of Search ................................. 438/684, 666, 438/669, 672, 719, 764

(56) References Cited

U.S. PATENT DOCUMENTS

| | | | | |
|---|---|---|---|---|
| 5,338,398 | * | 8/1994 | Szwejkowski et al. | 156/655 |
| 5,340,774 | * | 8/1994 | Yen | 438/301 |
| 5,381,046 | * | 1/1995 | Cederbaum et al. | 257/760 |
| 5,895,961 | * | 4/1999 | Chen | 257/382 |
| 5,976,977 | * | 11/1999 | Hong | 438/689 |
| 6,100,138 | * | 8/2000 | Tu | 438/253 |

* cited by examiner

*Primary Examiner*—John F. Niebling
*Assistant Examiner*—Lynne A. Gurley
(74) *Attorney, Agent, or Firm*—Jiawei Huang; J.C. Patents

(57) ABSTRACT

A method for planarizing a polysilicon layer is described. A polysilicon layer is etched with an oxygen-based gas and a halogen-based gas. The oxygen-based gas comprises an nitrogen oxide oxygen gas. The nitrogen oxide gas includes NO, $NO_2$, $N_2O$, or the combination thereof. The halogen-based gas includes a F, Cl, Br., I, $NF_3$, $SF_6$, $Cl_2$, HCl, $SiCl_4$, fluorocarbon, or a combination thereof. The fluorocarbon includes $CF_4$, $CHF_3$, $CH_2F_2$, $CH_3F$, or the like.

11 Claims, 2 Drawing Sheets

METHOD AND PLANARIZING POLYSILICON LAYER

CROSS-REFERENCE TO RELATED APPLICATION

This application claims the priority benefit of Taiwan application Ser. No. 88103215, filed Mar. 3, 1999, the full disclosure of which is incorporated herein by reference.

BACKGROUND OF THE INVENTION

1. Field of the Invention

The present invention relates to a semiconductor fabricating method. More particularly, the present invention relates to a method for planarizing a polysilicon layer.

2. Description of the Related Art

One of the conventional methods for planarizing a polysilicon layer is chemical-mechanical polishing. In order to obtain a planarized polysilicon layer, it is necessary to deposit a thick polysilicon layer. Planarization of the thick polysilicon layer is not affected by the topography of an underlying layer. However, if the thickness of the polysilicon layer increases, it requires a longer etching time to obtain a desired thickness and degree of planarization of the polysilicon layer. This, in turn, causes the fabrication costs to increase. The reliability of devices may be degraded, as well.

SUMMARY OF THE INVENTION

The invention provides a method for planarizing a polysilicon layer. A polysilicon layer is etched by isotropic dry etching. The isotropic dry etching is performed with an oxygen-based gas and a halogen-based gas.

In addition, the invention provides a method of fabricating a landing pad. A substrate comprising a metal oxide semiconductor transistor is provided. A cap layer is formed on a gate electrode of the metal oxide semiconductor transistor. A polysilicon layer is formed over the substrate. An isotropic dry etching step is performed to planarize the polysilicon layer. The polysilicon layer is patterned to form a landing pad on a source/drain region of the metal oxide semiconductor transistor. The polysilicon layer is etched by isotropic dry etching with an oxygen-based gas and a halogen-based gas.

In the isotropic dry etching, the oxygen-based gas comprises an nitrogen oxide and oxygen gas. The nitrogen oxide gas includes NO, $NO_2$, $N_2O$, or the combination thereof. The halogen-based gas includes F, Cl, Br, I, $NF_3$, $SF_6$, $Cl_2$, HCl, $SiCl_4$, fluorocarbon, or the combination thereof. The fluorocarbon includes $CF_4$, $CHF_3$, $CH_2F_2$, and $CH_3F$.

In comparison with a conventional method, which uses chemical-mechanical polishing, the present invention forms a planarized polysilicon layer by dry isotropic etching. A thick polysilicon layer, as seen in the conventional method, is unnecessary. Thus, the fabrication cost of the present invention is reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
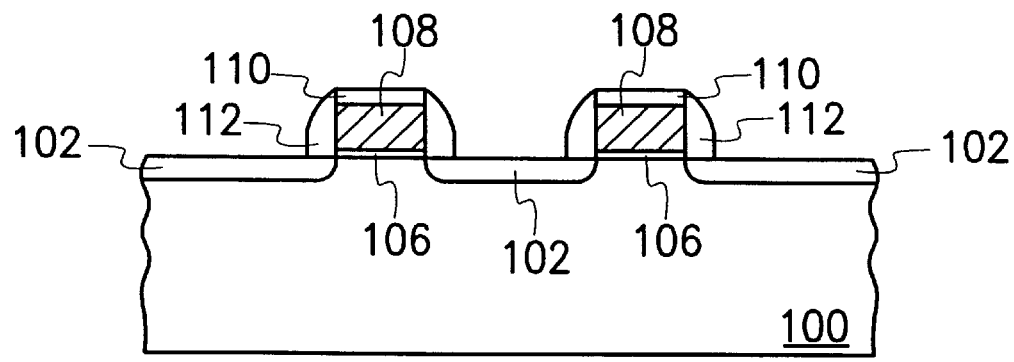
FIGS. 1A through 1E are schematic, cross-sectional views showing a method for planarizing a polysilicon layer utilized for forming a landing pad in a DRAM process according to one preferred embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1F are schematic, cross-sectional views showing a method for planarizing a polysilicon layer utilized for forming a landing pad in a DRAM process according to one preferred embodiment of the invention.

The preferred embodiment takes a planarization process utilized for forming a landing pad, which is used to connect a bit line to a node contact, as an example. However, the present invention is not limited to the preferred embodiment. The planarization process can be used in other suitable applications.

FIGS. 1A through 1F are schematic, cross-sectional views showing a method for planarizing a polysilicon layer utilized for forming a landing pad in a DRAM process according to one preferred embodiment of the invention.

In FIG. 1A, a metal oxide semiconductor (MOS) transistor is formed on a substrate 100. The MOS transistor comprises a gate electrode 108, a gate oxide layer 106, and a source/drain region 102. The source/drain region 102 in the substrate 100 is a lightly doped structure in this preferred embodiment, but any other structures may be used as the source/drain region 102. A cap layer 110 is formed on the gate electrode 108. A spacer 112 is formed on a sidewall of the gate electrode 108. The materials of the cap layer 110 and the spacer 112 preferably are isolation materials. Thus, the cap layer 110 and the spacer are able to isolate the gate electrode 108 from other conductive lines (not shown). Because the MOS transistor is formed on the substrate 100, the substrate 100 surface has a step height.

Figure 1B:
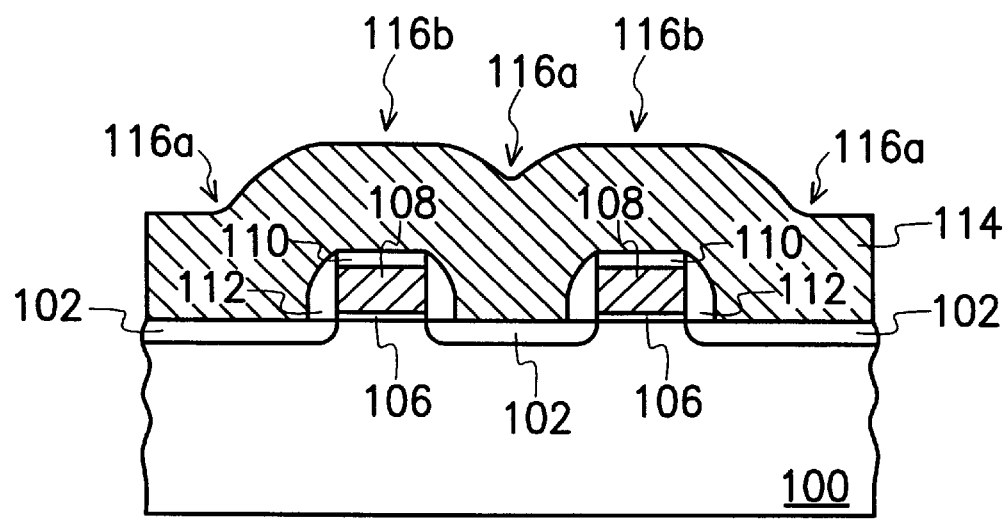
Figure 1C:
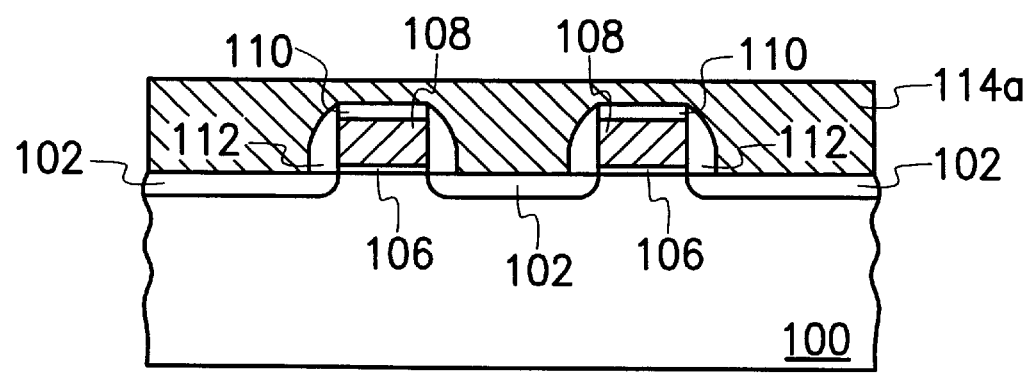
Figure 1D:
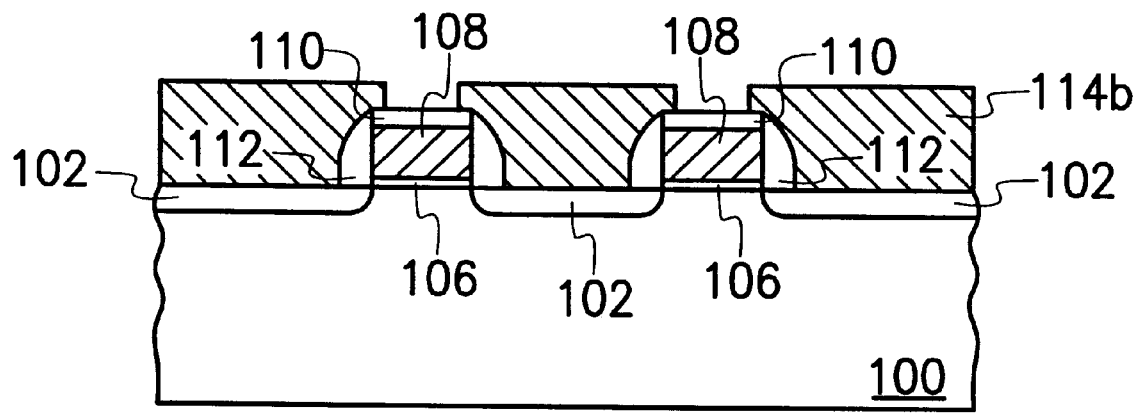

Reference is now made to FIGS. 1B through 1D, which describe how do a landing pad (shown in FIG. 1D) is formed on the source/drain region 102.

In FIG. 1B, a polysilicon layer 114 is formed over the substrate 100. The surface contour of the polysilicon layer 114 varies according to the contour of the substrate 100 surface. Thus, a recessed region 116a of the polysilicon layer 114 is formed above the source/drain region 102. A raised region 116b of the polysilicon layer 114 is formed above the gate electrode 108.

In FIG. 1C, an isotropic dry etching step is performed on the polysilicon layer 114, so as to planarize the polysilicon layer 114. The isotropic dry etching step is performed with an oxygen-based gas and a halogen-based gas. The oxygen-based gas includes NO, $NO_2$, $N_2O$, or the combination thereof. The halogen-based gas includes F, Cl, Br, I, $NF_3$, $SF_6$, $Cl_2$, HCl, $SiCl_4$, fluorocarbon, or the combination thereof. The fluorocarbon comprises $CF_4$, $CHF_3$, $CH_2F_2$, $CH_3F$, or the like.

The present invention uses the specific etching parameters to planarize the polysilicon layer 114, so as to obtain a planarized polysilicon layer 114a. The oxygen-based gas is advantageous for forming polymer. The halogen-based gas benefits the etching performance. Because the polymer easily forms on the recessed region 116a, the etching rate of the recessed region 116 is lowered. In addition, the etching rate for the raised region 116b of the polysilicon layer 114 is higher than the formation rate of polymer on the raised region 116b. Thus, the etching rate for the raised region 116b is higher than the etching rate for the recessed region 116a. Once a planarized polysilicon layer 114a is formed, the etching rates for different regions of the polysilicon layer 114a are almost the same.

In FIG. 1D, the polysilicon layer 114a is patterned. A landing pad 114b is formed on an electrically-coupled region, such as the source/drain region 102 in this preferred embodiment. The landing pad 114b is used for a bit line to electrically couple with a node contact (not shown). In the following step of forming a photoresist layer (not shown) over the substrate 100, because the polysilicon layer 114a is planarized, it is easy to obtain a planarized surface and a uniform thickness of the photoresist layer. Thus, the lithographic depth-of-focus is improved. Moreover, when patterning the polysilicon layer 114a, the etching step can be effectively controlled.

Figure 1E:
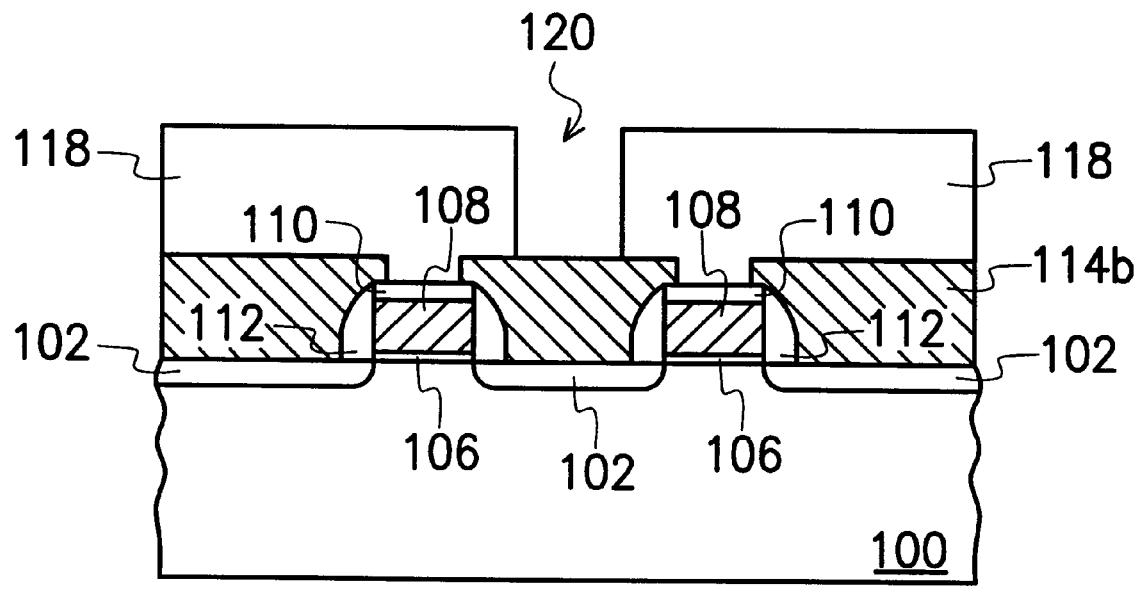

In FIG. 1E, a process of forming a bit line and a process of forming a capacitor are performed in sequence. An isolation layer 118 is formed over the substrate 100. The isolation layer 118 comprises an opening 120 exposing the landing pad 114b, if desired. Some follow-up steps are performed to complete the DRAM process. It is appreciated that the follow-up steps are well known to those skilled in the art, so these follow-up steps are not here described in detail.

In summary, the invention includes at least the following advantages:

1. A planarization of the polysilicon layer is obtained by isotropic dry etching.

2. In the dry isotropic etching step of the present innovation, the etching rate for a raised region is higher than the etching rate for a recessed region of the polysilicon layer. Once a planarized polysilicon layer is formed, the etching rates for different regions of the polysilicon layer are almost the same.

3. The dry etching step is performed with an oxygen-based gas and a halogen-based gas. The oxygen-based gas includes NO, $NO_2$, $N_2O$, or the combination thereof. The halogen-based gas includes F, Cl, Br, I, $NF_3$, $SF_6$, $Cl_2$, HCl, $SiCl_4$, fluorocarbon or the combination thereof. The fluorocarbon comprises $CF_4$, $CHF_3$, $CH_2F_2$, $CH_3F$, or the like.

4. In comparison with a conventional method, which uses chemical-mechanical polishing, a planarized polysilicon layer is obtained by dry isotropic etching. There is no need to form a thick polysilicon layer in the present invention. Thus, the fabrication cost of the present invention is reduced.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method for planarizing a polysilicon layer comprising:

etching the polysilicon layer with an oxygen-based gas and a halogen-based gas, wherein the etching rate for a raised region of the polysilicon layer is higher than the etching rate for a recessed region of the polysilicon layer.

2. The method of claim 1, wherein the oxygen-based gas comprises an nitrogen oxide and oxygen gas.

3. The method of claim 2, wherein the nitrogen oxide gas includes one selected from a group consisting of NO, $NO_2$, $N_2O$, and a combination thereof.

4. The method of claim 1, wherein the halogen-based gas includes one selected from a group consisting of F, Cl, Br, I, $NF_3$, $SF_6$, $Cl_2$, HCl, $SiCl_4$, fluorocarbon, and a combination thereof.

5. The method of claim 4, wherein the fluorocarbon includes one selected from a group consisting of $CF_4$, $CHF_3$, $CH_2F_2$, and $CH_3F$.

6. A method of fabricating a landing pad, comprising the steps of:

providing a substrate comprising a metal oxide semiconductor transistor, wherein a cap layer is formed on a gate electrode of the metal oxide semiconductor transistor;

forming a polysilicon layer over the substrate;

performing an isotropic dry etching step to planarize the polysilicon layer;

patterning the polysilicon layer to form a landing pad on a source/drain region of the metal oxide semiconductor transistor; and etching the polysilicon layer with an oxygen-based gas and a halogen-based gas.

7. The method of claim 6, wherein the oxygen-based gas comprises an nitrogen oxide and oxygen gas.

8. The method of claim 7, wherein the nitrogen oxide gas includes one selected from a group consisting of NO, $NO_2$, $N_2O$, and a combination thereof.

9. The method of claim 6, wherein the halogen-based gas includes one selected from a group consisting of F, Cl, Br, I, $NF_3$, $SF_6$, $Cl_2$, HCl, $SiCl_4$, fluorocarbon, and a combination thereof.

10. The method of claim 9, wherein the fluorocarbon includes one selected from a group consisting of $CF_4$, $CHF_3$, $CH_2F_2$, and $CH_3F$.

11. The method of claim 6, wherein a material of the cap layer comprises an isolation material.

* * * * *